United States Patent [19]

Legrady

[11] Patent Number: 5,017,159
[45] Date of Patent: May 21, 1991

[54] SOLID SINGLE LEG TERMINAL

[75] Inventor: Janos Legrady, Putnam Valley, N.Y.

[73] Assignee: Zierick Manufacturing Corporation, Mount Kisco, N.Y.

[21] Appl. No.: 415,964

[22] Filed: Oct. 2, 1989

[51] Int. Cl.$^5$ .......................................... H01R 13/415
[52] U.S. Cl. .................................... 439/741; 437/84; 437/870
[58] Field of Search .................................. 439/78–89, 439/733, 741, 870, 889

[56] References Cited

U.S. PATENT DOCUMENTS

| | | |
|---|---|---|
| 2,811,702 | 10/1957 | Narozny ............................... 439/741 |
| 2,914,745 | 11/1959 | Krol et al. ............................ 439/870 |
| 2,990,533 | 6/1961 | Hughes et al. . |
| 3,068,554 | 12/1962 | Pouget . |
| 3,184,532 | 5/1965 | Spera . |
| 3,445,929 | 5/1969 | Wolf . |
| 3,980,367 | 9/1976 | Laserson et al. . |
| 4,436,358 | 3/1984 | Coldren et al. . |
| 4,740,166 | 4/1988 | Barnhouse . |

FOREIGN PATENT DOCUMENTS 0604251  4/1960  Italy ................................... 439/870

Primary Examiner—Eugene F. Desmond
Attorney, Agent, or Firm—Brooks Haidt Haffner & Delahunty

[57] ABSTRACT

A solid single leg terminal includes an electrical conductor end portion at one end and an opposing substantially solid mounting end portion for mounting through a whole other printed circuit board. The mounting end portion forms an elongate mounting leg of substantially uniform cross-section and defines a longitudinal axis. The mounting leg is dimensioned to be substantially fully receivable within the whole from one side of the printed circuit board through to the other side of the printed circuit board. At least one elongate indentation is provided in the mounting end portion substantially parallel to the longitudinal axis to facilitate splitting of the mounting leg along the indentation into two half leg portions and splaying same into abutment against the other side of the printed circuit board to secure the position of the terminal on the printed circuit board.

17 Claims, 3 Drawing Sheets

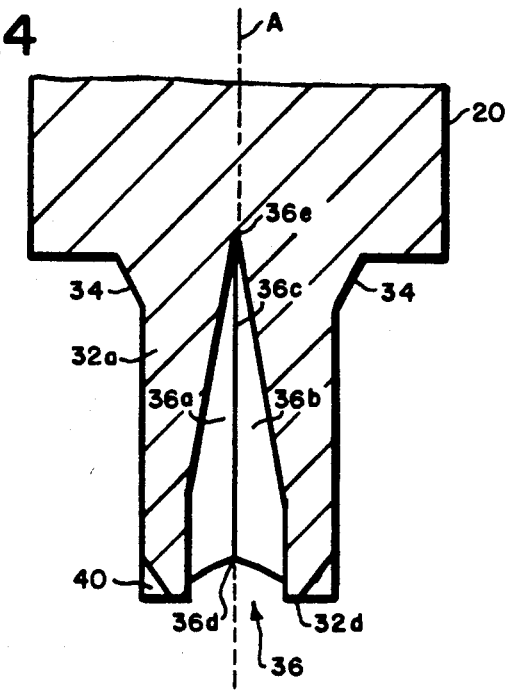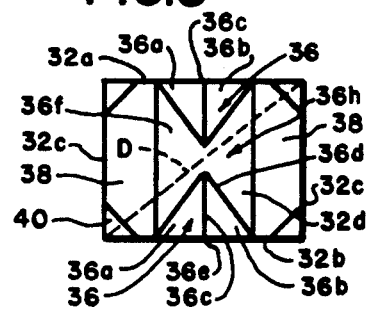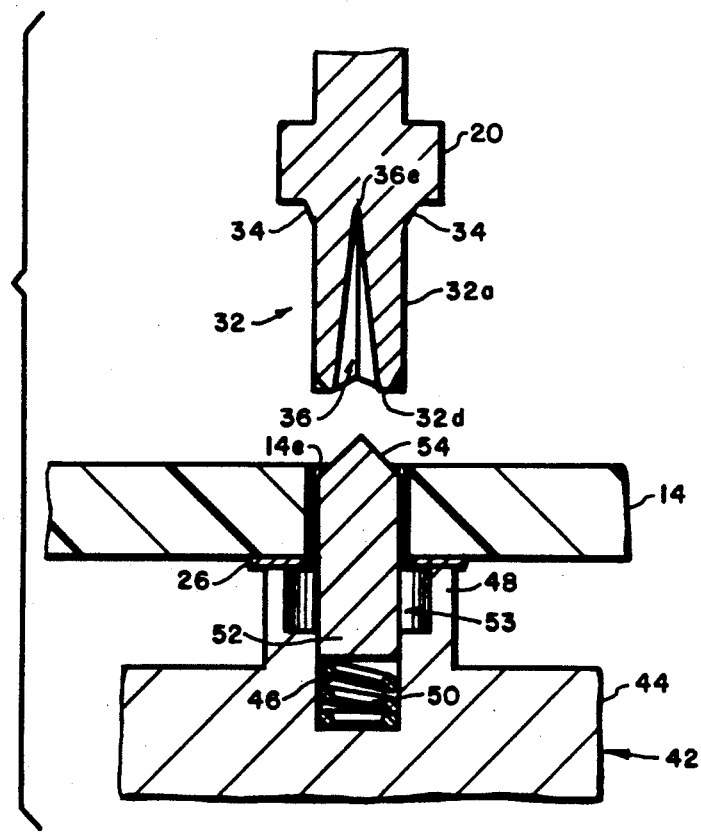

SOLID SINGLE LEG TERMINAL

BACKGROUND OF THE INVENTION

1. Field Of The Invention

This invention generally relates to electrical terminals for mounting electrical components on printed circuit (PC) boards and, in particular, to a solid single leg terminal suitable for mounting through a mounting hole on a PC board without cutting, deforming or otherwise damaging or affecting the integrity of the PC board.

2. Description Of The Prior Art

The conventional way to mount small electrical terminals (like pins and single leg tabs) on a printed circuit (PC) board is to force the mounting leg of the terminal into a hole on the PC board. The hole diameter is generally smaller than the diagonal or diameter of the mounting leg, so that there is an interference or press fit as shown in FIG. 1. FIG. 2 is an enlarged cross-section of the mounted pin of FIG. 1, showing the interference fit after soldering.

Where a press fit created between the terminal leg and the PC board hole is tight, it produces stresses in the PC board which, if excessive, can crack or warp the board. Also, the insertion force is significantly higher, which may cut into or deform the terminal. An interference fit will also produce board material shavings and excessive board material displacement around the hole which make soldering difficult and can produce a weak solder joint.

In U.S. Pat. No. 4,363,529, the mounting legs establish an interference fit of the legs in the circuit board hole, the legs penetrating the material of the circuit board relatively deeply. It is stresses of this type that the subject invention seeks to eliminate.

An electrical terminal is subject to several different forces (insertion, withdrawal, contact, normal force, vibration, shock, etc.). As above suggested, if the terminal is soldered into the PC board hole with very little interference fit, those forces will be transmitted directly to the solder joint instead of to the board material, which may result in cracking of the solder joint. In an effort to avoid the aforementioned problems, efforts have been made to insure that just the right interference fit exists between the PC board hole and the terminal leg. However, this has necessitated the use of tight tolerances, typically in the range of ±0.002 inches.

A number of compliant spade type terminals have been proposed which typically include a pair of spaced legs facing each other, with each of the legs being provided with an outwardly expanded hook portion which forms an elastic contact for compressed fitting with a through hole. The resulting prongs extend through the hole or bore in the printed circuit board to secure the terminal by snapping into place once the prongs have been fully inserted through and exit the hole. Typical of constructions of this type is the terminal disclosed in U.S Pat. No. 4,353,609.

It has also been proposed that the electrically conductive portions of a component or terminal to be mounted be passed through the hole on one side of the circuit board and at least two spaced conductors bent in opposite directions into contact with the soldering conductors or pads on the other side of the board. Typical art of this type is shown in U.S. Pat. No. 3,068,554 and 3,184,532. In the first mentioned patent, a process is disclosed for making magnetic core memory, wherein the ends of staples are bent back against the lower face of the circuit board by the use of a conical mating tool driven between adjacent but spaced staples. In the latter patent, a flaring tool in the shape of a truncated cone is used to bend lead wires of an electrical component toward terminal portions on the bottom of the panel. See also U.S. Pat. Nos. 3,479,634 and 3,536,869. In U.S. Pat. No. 2,869,107, the protruding tabs are twisted to lock the position of the terminal and prevent the tabs from being removed through the openings through which they were inserted.

In some instances, the art has suggested the use of generally cylindrical one legged terminals which are, however, hollow. In U.S. Pat. No. 3,980,367, a hollow-type rivet is deformed by striking it with a hammer or other instrument after it is passed through the hole in the board. Similar terminals are disclosed in U.S. Pat. Nos. 2,990,533; 2,947,964 and 3,445,929, wherein the hollow mounting legs are splayed by various tools.

A circuit board pin is disclosed in U.S. Pat. No. 4,740,166 has a compliant portion formed by two side-by-side beams joined along one edge to produce a longitudinal V-shaped groove. The resulting elastic hinge insures good contact with a conductive sleeve material which lines the through hole.

A terminal tab intended for mounting on a circuit board is disclosed in U.S. Pat. No. 4,436,358 which includes a mounting leg made of flat strip material provided with a longitudinal slot to divide the leg into two sections which are of decreasing width with increasing distance from the base portion mounted on the PC board. The terminal is mounted on a PC board by inserting the tapered leg sections through a hole in the board, the leg portions being deformed or bent in opposite directions by a ram-like member provided on the underneath side of the board. The patentee teaches, however, that the dimensions of the leg should be selected such that a tapered portion of the leg at the upper surface of the board likewise be forced into the circuit board in order to provide an interference fit of the leg in the circuit board.

Thus, the known prior art terminals generally tend to fall into one of two general categories. The first includes mounting legs having at least one dimension greater than the size of the hole through which the mounting leg is placed to cut into the board or otherwise move or deform the board material. The second involves mounting legs which have generally circular cross-sections which can be received within the mounting holes without an interference fit. However, such hollow mounting legs complicate the terminals and increase the manufacturing costs since such terminals cannot simply be made as inexpensively as from strip material nor as easily produced on continuous carrier strips.

SUMMARY OF THE INVENTION

An object of the present invention is to provide a solid single leg terminal which can be easily and conveniently mounted on a printed circuit board.

It is another object of the present invention to provide a solid single leg terminal which is simple in construction and inexpensive to manufacture.

It is still another object of the present invention to provide a solid single leg terminal which can be mounted without requiring an interference fit within a mounting hole and, therefore, which does not produce stresses, deformations or cracks within the printed circuit board.

It is yet another object of the present invention to provide a solid single leg terminal of the type mentioned in the other objects which can be easily and inexpensively manufactured on continuous carrier strips for use in automated terminal mounting equipment.

It is a further object to provide a terminal which eliminates the need for tight tolerances on the mounting hole diameter and terminal leg size, only requiring tolerances of ±0.006 and larger.

It is still a further object to provide a terminal as above suggested which lowers the solder joint stress level by transferring the forces which act on the terminal body to the PC board material not to the solder joint.

It is yet another object to provide a terminal as in the aforementioned objects which results in improved soldering by providing better solder geometry.

In order to achieve the above objects, as well as others which will become apparent hereafter, a solid single leg terminal in accordance with the present invention comprises an electrical connector end portion at one end and opposing substantially solid mounting end portion for mounting through a hole of a printed circuit (PC) board. The mounting end portion forms an elongate mounting leg of substantial uniform cross section and defines a longitudinal axis. The mounting leg is dimensioned to be substantially freely receivable within the mounting hole from one side of the PC board through to the other side of the PC board. At least one elongate indentation is provided in the mounting end portion substantially parallel to the longitudinal axis to facilitate the splitting of the mounting leg along the indentation into two half leg portions and splaying same into abutment against the other side of the PC circuit board to secure the position of the terminal on the PC board.

Advantageously, at least one central shoulder is provided intermediate the connector and mounting end portions which serves as a stop to limit excessive passage through and fix the position of said mounting leg within the hole.

In accordance with a presently preferred embodiment, two indentations are provided which are in the form of coins formed on opposite sides of the mounting leg. Each coin is defined by two inwardly convergent surfaces meeting at a frangible joining line of minimum material thickness. Each of the coins has a triangular cross section of decreasing dimensions in the direction of the connector end portion in planes normal to the longitudinal axis.

The solid single leg terminal in accordance with the present invention has the advantage of extremely low cost of manufacture while providing secure mounting of components on the PC board without damage or deformation to the boards. Accordingly, the solid single leg terminal in accordance with the present invention provides a very efficient and inexpensive way to promote the quality and useful life of PC boards.

BRIEF DESCRIPTION OF THE DRAWINGS

For a more detailed understanding of the manner in which the object and advantages of the invention may best be achieved, reference will now be had to the following description taken in conjunction with the accompanying drawings, in which:

FIG. 4 is an enlarged front elevational view of the mounting leg and the details of the indentation or coin formed on one side of the mounting leg;

FIG. 5 is a bottom plan view of the mounting leg shown on FIG. 4;

FIG. 6 is a diagramatic view, in front elevation, illustrating a solid single leg terminal in accordance with the invention just prior to mounting on a printed circuit board and the insertion mechanism for securing the terminal to the board;

DESCRIPTION OF THE PREFERRED EMBODIMENTS

Figure 1:
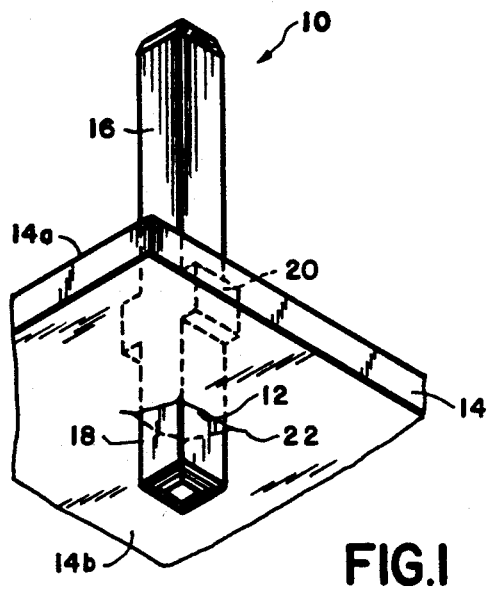
FIG. 1 is a perspective view of a conventional or known solid single leg terminal, illustrating how these terminals have created cracks in the boards in which they have been mounted.
Figure 2:
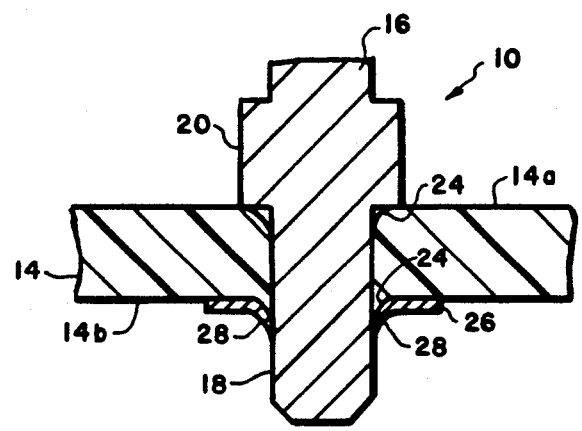
FIG. 2 is an enlarged side elevational view of the terminal shown on FIG. 1, taken in cross section, and illustrating the difficulties in soldering the terminals to the conductive pads as a result of the deformation of the printed circuit board.

Referring now to the figures, wherein identical or similar parts are designated by the same reference numerals throughout, and first referring to FIGS. 1 and 2, the disadvantages inherent in the use of the prior art solid single leg terminals are illustrated. The reference numeral 10 generally designates the single leg pin-type terminal intended for mounting through a mounting opening 12 within a printed circuit (PC) board 14. The terminal 10 has an upper connecting pin 16 and a lower mounting or insertion leg portion 18. An intermediate or center shoulder, flange or projection 20 may be provided on the terminal 10 which serves as a stop to limit excessive passage through and fix the position of the mounting leg 18 in the opening 12. Typically, the components are mounted on the upper surface 14a of the PC board 14, while the conductive soldering pads or lands are provided on the other or lower surface 14b (not shown). As previously suggested, mounting legs 18 of this type are typically forced into the openings 12 to create a force or interference fit, this creating stresses and deformations within the PC board which can lead to cracks 22, particularly after extended periods of time and under adverse temperature conditions (FIG. 1).

In FIG. 2, an associated problem in the use of such conventional terminals is illustrated where the displacement of material is shown (at 24) which creates a build up of such material 14c in the region of the soldering or conductive pads 26. Such build up interferes with the application of solder 28 which may create bad solder joints and decrease the quality of the electrical connections.

Figure 3:
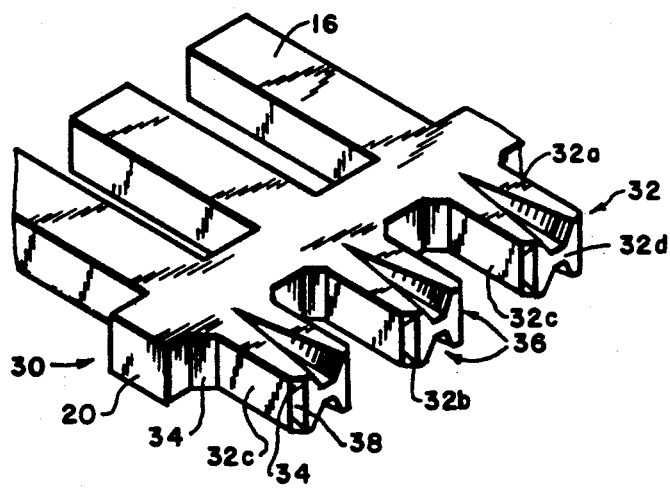
FIG. 3 is a perspective view illustrating the solid single leg terminals in accordance with the present invention mounted on a continuous carrier strip.

Referring to FIG. 3, there is shown a strip 30 of series connected solid single leg terminals connected to each other at the mid-shoulder portions 20 which together form a carrier strip. Each solid single leg terminal 30 includes a mounting leg 32, to be more fully described, which extends to one side of the mid-shoulder portion 20. To each side of the mounting leg 32, there is advantageously provided an upper tapered seat surface 34 which extends between the mounting leg 32 and the midshoulder portion 20, for reasons which will be more evident from the discussion of FIGS. 7 and 8.

Each mounting leg 32 includes front and rear surfaces 32a, 32b, side surfaces 32c and lower or bottom surface 32d.

Formed in the front and rear surfaces 32a and 32b are indentations which are in the nature of separation coins, such as by squeezing between two dies substantially parallel to the longitudinal axis of the terminal to facilitate splitting of the mounting leg 32 along the indentations 36, as to be more fully described.

Referring to FIGS. 3-5, the leading end of the mounting leg 32 is advantageously provided with lateral lead-in surfaces 38 and lead-in coins 40 to round out the remote end of the mounting leg to facilitate insertion into a mounting hole of a printed circuit board.

The separation coins 36 are shown in FIG. 5 as being symetrically arranged on opposite sides of the mounting leg 32. Each of the separation coins 36 are formed by two inwardly convergent surfaces 36a, 36b which meet at a frangible joining line 36c which also defines the region of minimum material thickness of the mounting leg. As best shown in FIGS. 3, 4 and 5, each of the coins 36 generally has a triangular cross-section of decreasing dimensions in the direction of the connector end of the portion 16 and can extend into the region of the midshoulder portion 20, in planes normal to the longitudinal axis of the terminal. With the coins 36 as shown, the region of minimum material thickness is at 36f (FIG. 5) where the two frangible joining lines 36c are the closest. It is at 36f that the mounting leg 32 is the weakest and most susceptible to splitting. Since the frangible joining lines 36c radiate outwardly until they meet the front and rear surfaces 32a, 32b, the uppermost portions 36e of the separation coins 36 are at maximum thickness or at a separation equal to the thickness of the mounting leg 32 itself. Accordingly, the separation coins 36, as arranged and configured, become gradually more rigid from the lower most or end portion 36f to the uppermost portion 36e. In between, the separation coins 36 gradually weaken the mounting leg 32 in the direction of the lowermost end (at 36d).

In accordance with the presently preferred embodiments, the mounting legs 32 have a substantially uniform rectangular cross section, and are dimensioned to be substantially freely receivable within a hole from one side of a PC board through to the other side of the PC board without an intereference fit. In the disclosed embodiments, the mounting legs have substantially uniform cross-sectional configurations along the longitudinal axis or length direction of the terminal. This requires, therefore, that for insertion of the mounting legs within a PC mounting hole of diameter D, every dimension in the cross section of the mounting leg must be less than D, including the diagonals extending between diagonally opposing corners or edges of the mounting leg, as suggested by the dash line A in FIG. 5. In accordance with one construction, the thickness of the mounting leg between surfaces 32a and 32b is 0.045 inches (11.4 mm), while the width of the mounting leg between the side surfaces 32c is 0.057 inches (14.5 mm). With this construction, the maximum width of the separation coins (and the plane of the lower surface 32d) is 0.02 inches.

Referring to FIG. 3, the terminals are shown in the form of a continuous strip, as above described. Parts carried from shoulder to shoulder 20, and terminals can be removed from the strip at the time of installation on the PC board by means of automatic or semi-automatic insertion machines. After the terminal is separated from the carrier, the machines lines up the terminal with the PC board hole and inserts the mounting leg 32 into the PC board hole.

Figure 7:
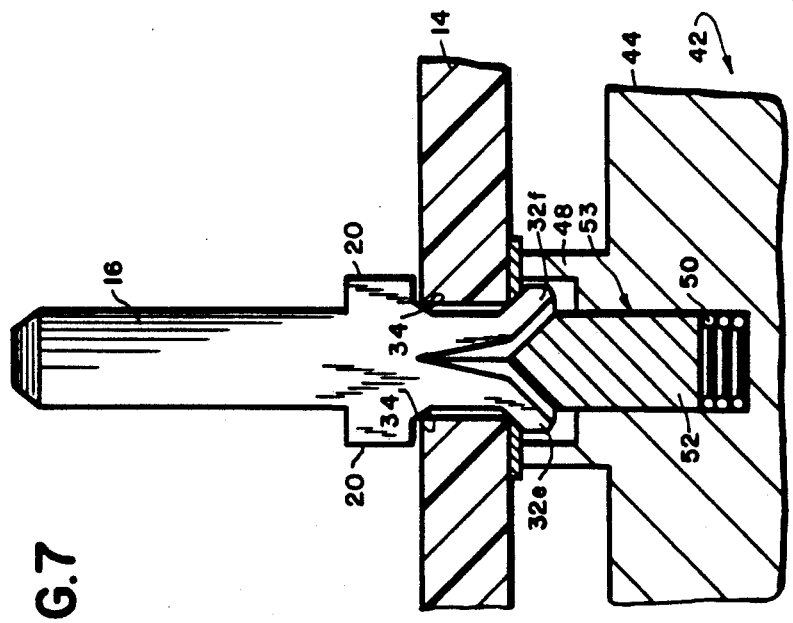
FIG. 7 is similar to FIG. 6, but showing the insertion mechanism and the terminal at the point where the leg has been split and splayed.

The use of the solid single leg terminal will now be described in connection with FIGS. 6 and 7. FIG. 6 shows the terminal before insertion into printed circuit board, and FIG. 7 shows the terminal after insertion. The mounting leg 32 is initially aligned with the PC board hole 14c. An insertion mechanism 42 is provided which includes a support block 44 provided with a bore 46 and upwardly extending support arms 48. Positioned within the bore 46 is a compression spring 50 which supports a round shank 52 to form a spring loaded anvil 53 having an upwardly extending wedge-shaped end 54 as shown. The round shank 52 has a diameter which is smaller than the diameter of the printed circuit board hole 14c.

The spring-loaded anvil 53 serves three functions. The round shank 52 helps to locate the PC board hole in the right position. Additionally, the wedge-shaped end 54 splits the mounting leg 32 along the separation coins 36 and splays the two halves of the mounting leg 32 over the soldering pads or conductors 26. In the same figure, the upper tapered seat surfaces 34 are shown as locating surfaces which insure the centering of the mounting leg within the PC board hole 14c.

It is an important feature of the present invention that the solid single leg terminal of the invention is freely received and not supported by an interference fit between the mounting leg 32 and the PC board hole 14c. As above mentioned, the diagonal of the mounting leg is smaller than the diameter of the mounting hole so that there is a loose fit or clearance between the mounting leg 32 and the PC board hole. The terminal sits on the tapered upper seat surface 34 on the edge of the hole on the upper side of the PC board. The terminal is held in place securely by the two halves of the mounting leg, which is splayed (formed) outwardly after being split over the lower surface edge of the PC board hole. Since a terminal sits on and is held in place by tapered surfaces on the edge of the hole, the mounting hole diameter can have a much larger tolerance than that required for a press fit-type mounting.

Figure 8:
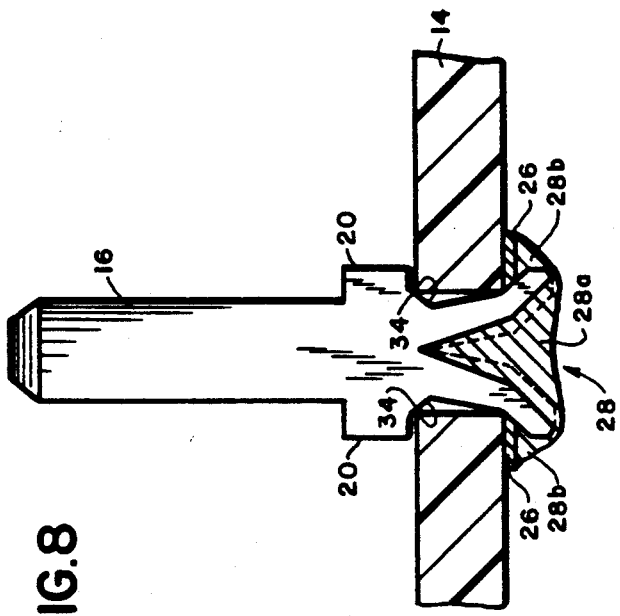
FIG. 8 is similar to FIG. 7, showing the splayed portions soldered to the printed circuit board.

In FIG. 8, solder 28 is shown applied to the underside of the PC board to mechanically and electrically join the split and splayed mounting leg portions 32e and 32f to the conductive lands or soldering pads 26. Since there is no build up of displaced material, as with the prior art arrangements, solder 28 can fill the regions 28a and 28b around the portions 32e, 32f to provide good mechanical and electrical contact. As shown in FIG. 8, during soldering, the melted solder runs up inside the separation coin from the lower surface of the PC board to the upper surface because of capillary action. When the gap between the two halves of the mounting leg fills with solder 28a and the solder hardens, it prevents the splayed leg portions 32e, 32f from moving towards each other or closing in again (from straightening out) when a pulling force is applied to the terminal. This also increases the terminal board anchoring retention. Also, since the leg halves are formed directly over the soldering pad, the solder fills the gap between the leg halves and the pad, increasing the solder area. Unlike an interference fitted pin, there is no displaced PC board material to weaken the solder joint.

Figure 9:
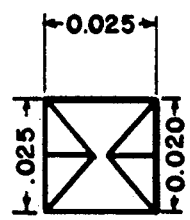
FIG. 9 is similar to FIG. 5, but showing a solid single leg terminal having a different configuration and dimensions in accordance with another embodiment of the invention.

Referring to FIG. 9, another example of a solid single leg terminal is shown, similar to FIG. 5, with the exception that the dimensions are different. Instead of 0.045 inches stock, 0.025 inches stock is used with defines the thickness of the terminal. The width of the mounting leg is 0.025 inches, while the maximum dimension of the separation coins in the planes of the front and rear surfaces 32a, 32b is still 0.020 inches. Clearly, the specific dimensions for the terminal are not critical, as long as the dimensions of the mounting legs 32 satisify the condition that they can be inserted within a mounting hole of a PC board without an interference fit.

A significant difference between the solid single leg terminals in accordance with the present invention and those known in the prior art is that by using separation coins, it is possible to split a square leg (width of leg equal with the material thickness) into two halves. The prior art mounting legs had to be wider because of a pierced slot or a sheared line was needed at the center of the mounting leg to split it in half. It is not possible to shear a square leg in half (lengthwise) by using conventional stamping and insertion machine technology.

Figure 10:
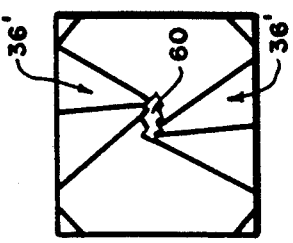
FIG. 10 is similar to FIGS. 5 and 9, but showing still another embodiment in accordance with the invention wherein the coins on the opposite sides of the mounting leg are slightly offset or misaligned from each other.

Referring to FIG. 10, an alternate embodiment is shown wherein the separation coins are slightly off center with respect to each other, so that the separation coins can be made deeper than half of the material thickness, and typically a crack 60 will develop along the coining regions of reduced thickness. This crack in the center of the mounting leg helps to split the leg in half. The separation coin has a very gradual run-out to prevent stress concentration at the end of the coining.

As above suggested, while the cross section of the mounting leg is substantially a uniform rectangular cross-section along its longitudinal length, such cross-section can also be square if the size of the printed circuit mounting hole is to be circular with a minimum diameter.

Although preferred embodiments of the invention have been described, it should be understood that various modifications may be made by those skilled in the art without departing from the spirit of the invention. It is the intention, therefore, that the scope of the invention be limited only as indicated by the claims that follow.

What is claimed:

1. A solid single leg terminal comprising an electrical conductor end portion at one end and an opposing substantially solid mounting end portion for mounting through a hole of a printed circuit board, said mounting end portion forming an elongate mounting leg of substantially uniform cross section and defining a longitudinal axis, said mounting leg being dimensioned to be substantially freely receivable within the hole from one side of the printed circuit board through to the other side of the printed circuit board; and two elongate indentations in said mounting end portion substantially parallel to said longitudinal axis to facilitate splitting of said mounting leg along said indentations into two half leg portions and splaying same into abutment against the other side of the printed circuit board to secure the position of the terminal on the printed circuit board, said two indentations being provided and comprising coins formed on opposite sides of said mounting leg, each coin being defined by two inwardly convergent surfaces meeting at a frangible joining line of minimum thickness material, and each of said coins having triangular cross sections of decreasing dimensions in the direction of said connector end portion in planes normal to said longitudinal axis.

2. A terminal as defined in claim 1, wherein the frangible joining lines of opposite coins are aligned in a common plane parallel to said axis.

3. A terminal as defined in claim 1, wherein the frangible joining lines of opposite coins are offset on opposite sides of a plane of symmetry passing through said axis.

4. A terminal as defined in claim 1, wherein the hole in the printed circuit board defines a circular ridge in said one side of the printed circuit board, further comprising intermediate abutment portions on said mounting leg for positioning and aligning said mounting leg in a position to be split and splayed.

5. A terminal as defined in claim 1, wherein said electrical connector portion comprises a connecting pin.

6. A terminal as defined in claim 1, wherein said elongate mounting leg has a substantially uniform rectangular cross-section along said longitudinal axis.

7. A terminal as defined in claim 6, wherein said cross-section is square.

8. A terminal as defined in claim 1, further comprising at least one central shoulder intermediate said connector and mounting end portions serving as a stop to limit excessive passage through and fix the position of said mounting passage within the hole.

9. A terminal as defined in claim 8, wherein two central shoulders are provided on opposite sides of the terminal.

10. A terminal as defined in claim 1, further comprising lead-in coins at the free ends of said mounting leg to reduce the cross-sectional area of said mounting leg at the portion thereof first entering the hole of the printed circuit board thereby facilitating the guidance and insertion of said mounting leg into the hole.

11. A terminal as defined in claim 10, wherein said lead in coins comprise a plurality of tapered surfaces.

12. A solid single leg terminal comprising an electrical conductor end portion at one end and an opposing substantially solid mounting end portions for mounting through a hole of a printed circuit board, said mounting end portion forming an elongate mounting leg of substantially uniform cross section and defining a longitudinal axis, said mounting leg being dimensioned to be substantially freely receivable within the hole from one side of the printed circuit board through to the other side of the printed circuit board; at least one elongate indentation in said mounting end portion substantially parallel to said longitudinal axis to facilitate splitting of said mounting leg along said indentation into two half leg portions and splaying same into abutment against the other side of the printed circuit board to secure the position of the terminal on the printed circuit board; and two central shoulders intermediate said connector on opposite sides of the terminal and mounting and portions serving as a stop to limit excessive passage through and fix the position of said mounting leg within the hole, a plurality of terminals being connected at said central shoulders to provide a continuous carrier strip from which individual terminals can be serviced.

13. A solid single leg terminal comprising an electrical conductor end portion at one end and an opposing substantially solid mounting end portion for mounting through a hole of a printed circuit board, said mounting end portion forming an elongate mounting leg of substantially uniform cross section and defining a longitudinal axis, said mounting leg being dimensioned to be substantially freely receivable within the hole from one side of the printed circuit board through to the other side of the printed circuit board; at least one elongate indentation in said mounting end portion substantially parallel to said longitudinal axis to facilitate splitting of said mounting leg along said indentations into two half leg portions and splaying same into abutment against the other side of the printed circuit board to secure the position of the terminal on the printed circuit board, the hole in the printed circuit board defining a circular ridge in said one side of the printed circuit board, and further comprising intermediate abutment portions on said mounting leg for positioning and aligning said mounting leg in a position to be split and splayed, said abutment portions comprising outwardly tapered seats arranged on opposite sides of said mounting leg.

14. A solid single leg terminal comprising an electrical conductor end portion at one end and an opposing substantially solid mounting end portion for mounting through a hole of a printed circuit board, said mounting end portion forming an elongate mounting leg of substantially uniform cross section and defining a longitudinal axis, said mounting leg being dimensioned to be substantially freely receivable within the hole from one side of the printed circuit board through to the other side of the printed circuit board; at least one elongate indentation in said mounting end portion substantially parallel to said longitudinal axis to facilitate splitting of said mounting leg along said indentations into two half leg portions and splaying same into abutment against the other side of the printed circuit board to secure the position of the terminal on the printed circuit board, said indentation means being formed in surfaces having predetermined widths and said indentation means having a maximum width dimension in said surfaces of said mounting leg which are within the range of approximately 25%-25% of said predetermined width.

15. A terminal as defined in claim 14, wherein two indentations are provided and comprises coins formed on opposite sides of said mounting leg.

16. A terminal as defined in claim 14, wherein said indentation is provided at least on one side of said mounting leg.

17. A terminal as defined in claim 5, wherein indentations are provided on opposite sides of said mounting leg.

* * * * *

UNITED STATES PATENT AND TRADEMARK OFFICE
CERTIFICATE OF CORRECTION

PATENT NO.   : 5,017,159
DATED        : May 21, 1991
INVENTOR(S)  : LEGRADY, Janos It is certified that error appears in the above-identified patent and that said Letters Patent is hereby corrected as shown below:

Column 5, line 12       Change "midshoulder" to --mid-shoulder--.

Column 8, line 50       Change "portions" to --portion--.

Column 8, line 65       Change "and" (second occurrence) to --end--.

Column 10, line 18      Change "25%-25%" to --25%-35%--.

Signed and Sealed this

Fifth Day of January, 1993

Attest:

DOUGLAS B. COMER

*Attesting Officer*      Acting Commissioner of Patents and Trademarks